United States Patent [19]
Fujita

[11] Patent Number: 6,002,154
[45] Date of Patent: Dec. 14, 1999

[54] HIGH-FREQUENCY MOSFET

[75] Inventor: Koichi Fujita, Tokyo, Japan

[73] Assignee: Mitsubishi Denki Kabushiki Kaisha, Tokyo, Japan

[21] Appl. No.: 09/111,774

[22] Filed: Jul. 8, 1998

[30] Foreign Application Priority Data

Jan. 20, 1998 [JP] Japan .................................. 10-008435

[51] Int. Cl.$^6$ ................................................. H01L 29/40
[52] U.S. Cl. ........................ 257/349; 257/348; 257/349; 257/350; 257/351; 257/352; 257/353; 257/354; 257/59; 257/72
[58] Field of Search ............................... 257/59, 72, 347, 257/348, 349, 350–354

[56] References Cited

FOREIGN PATENT DOCUMENTS 7283414  10/1995  Japan .
9045789   2/1997  Japan .

OTHER PUBLICATIONS

Hisamoto et al.; "Advanced 0.1 μm CMOS for RF Application", Technical Report of IEICE, ICD96–86 (1996–07) pp. 15–19.

Schmitz et al.; "A Deep–Submicrometer Microwave/Digital CMOS/SOS Technology", IEEE Electron Device Letters, vol. 12, No. 1, Jan. 1991, pp. 16–17.

*Primary Examiner*—Fetsum Abraham
*Attorney, Agent, or Firm*—Leydig, Voit & Mayer, Ltd.

[57] ABSTRACT

A high frequency MOSFET device includes a Silicon-On-Insulator substrate. The MOSFET device has a source electrode connected to the substrate by a conductive region penetrating the insulator layer for dissipating heat from the drive section of an MOSFET to the substrate. The conductive region may be in a grid pattern or lattice configuration, surrounding the drive section of each MOSFET on the SOI substrate, opposite the source electrode of the MOSFET.

7 Claims, 5 Drawing Sheets

HIGH-FREQUENCY MOSFET

BACKGROUND OF THE INVENTION

1. Field of the Invention

The present invention relates to a MOSFET device which operates at high frequencies, particularly to a MOSFET device on an SOI (silicon-on-insulator) structure substrate, and a method of manufacturing the MOSFET device.

2. Description of the Related Art

In a high-frequency prior art MOSFET, operation at high frequencies can be improved by connecting a $P^+$ diffused region 19 to a $P^+$ semiconductor substrate (sub-layer) 1, just below a source electrode as shown in FIG. 8, thereby decreasing source inductance and ON-state resistance. To improve the high-frequency characteristics further, it is desired that the high-frequency MOSFET use an SOI substrate in which a thin film semiconductor layer having a thickness of several tens of nanometers is disposed on an insulating layer on a semiconductor substrate 1. However, such an insulating layer on a silicon semiconductor substrate makes it impossible to form the $P^+$ diffused region connecting the semiconductor substrate in the same way as in the prior art. In FIG. 8, numeral 10 denotes a gate oxide film, 11 denotes a gate electrode, 12 denotes a CVD inter-layer film, 14 denotes a P type channel layer, 15 denotes an $N^-$ type LDD layer, 16 denotes $N^+$ type source and drain layers, and 18a and 18b denote a source electrode and a drain electrode, respectively.

In order to overcome the connection problem, it has been proposed in Japanese Patent Kokai Nos. 7-283414 and 9-45789 to form a conductive portion that penetrates the insulating layer and connects to the $P^+$ type substrate 1, just below the source electrode.

However, manufacture of an integrated circuit based on silicon, having a high degree of integration and high performance, requires wiring for the conductive portion with strips several micrometers wide in the SOI-MOSFET. Etching of an Si trench several micrometers wide before forming wiring for the source and the drain is difficult.

An SOI substrate has a low thermal conductivity because an $SiO_2$ layer is interposed as an insulating layer, so that it is not suitable for a high power output device, such as a high-frequency MOSFET, which generates heat.

SUMMARY OF THE INVENTION

The present invention has been accomplished to solve the problems of the prior art. An object of the present invention is to provide a new conductive configuration suitable for an SOI-MOSFET device having a high degree of integration and a method of manufacturing the SOI-MOSFET device.

Another object of the present invention is to provide a heat dissipation configuration suitable for a high-frequency SOI-MOSFET and a method of manufacturing the SOI-MOSFET.

According to a first aspect of the present invention, there is provided a high-frequency MOSFET device on an SOI substrate comprising a semiconductor layer of a first conductivity type on a grounded semiconductor substrate of the first conductivity type with an intervening insulating layer, wherein a source electrode of the MOSFET is connected to the grounded semiconductor substrate by a conductive region that penetrates the insulating layer, and the conductive portion is an embedded electrode that dissipates heat from the MOSFET to the semiconductor substrate.

According to the present invention, the SOI substrate in the high-frequency MOSFET can further decrease source inductance and ON-state resistance and improve the heat dissipation from the device, resulting in high performance for a long time.

In a preferred embodiment, the conductive portion comprising the embedded electrode may have a grid pattern or lattice configuration and surround each MOSFET-on the SOI substrate, directly below the source electrode, thereby further improving the heat dissipation efficiency of the devices.

In another preferred embodiment, the drain electrode of the MOSFET connected to the embedded electrode in the drain contact further decreases the drain-substrate capacitance and gate-drain capacitance.

According to a second aspect of the present invention, there is also provided a method of manufacturing a high-frequency MOSFET device on an SOI substrate comprising a semiconductor layer of the first conductivity type on a grounded semiconductor substrate of the first conductivity type with an intervening insulating layer, wherein a source electrode of the MOSFET is connected to the grounded semiconductor substrate by a conductive region that penetrates the insulating layer, comprising:

forming holes in a wafer;

embedding an Si-containing material in the holes to form Si trenches;

removing the embedded Si-containing materials from the Si trenches to obtain minute trench holes; and embedding a metal or metals in the minute trench holes.

According to the present method invention, formation of the holes in an early stage of wafer processing and maintenance of the holes by filling with an Si containing material make it possible to form the holes as small as several micrometers before forming the source-drain wiring, thereby making a wiring configuration allowing a high degree of integration.

In the step of embedding the Si-containing material in the holes, it is preferable to subject the wafer to field oxidation. In this case, $SiO_2$ is grown as the Si material.

In the step of removing the $SiO_2$ from the holes, it is preferable to remove the $SiO_2$ selectively by wet etching, resulting in minute trench holes with high accuracy, even with a rough resist pattern.

In the step of embedding the electrode in the trench holes just below the source electrode, it is preferable to embed the electrodes in the drain contact hole, resulting in a decrease of the drain-substrate capacitance and the gate-drain capacitance.

Further, the trench hole pattern just below the source electrode may have a grid pattern or lattice configuration so the wiring pattern can have a high heat dissipation efficiency.

DESCRIPTION OF THE PREFERRED EMBODIMENTS

Embodiment 1

Figure 1A:
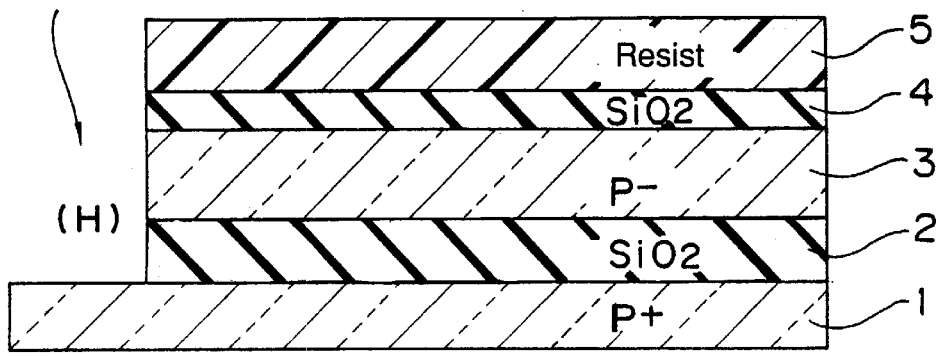
FIGS. 1A, 1B, and 1C are cross-sectional views showing a process for manufacturing a conductive region according to a first embodiment of the present invention.
Figure 1B:
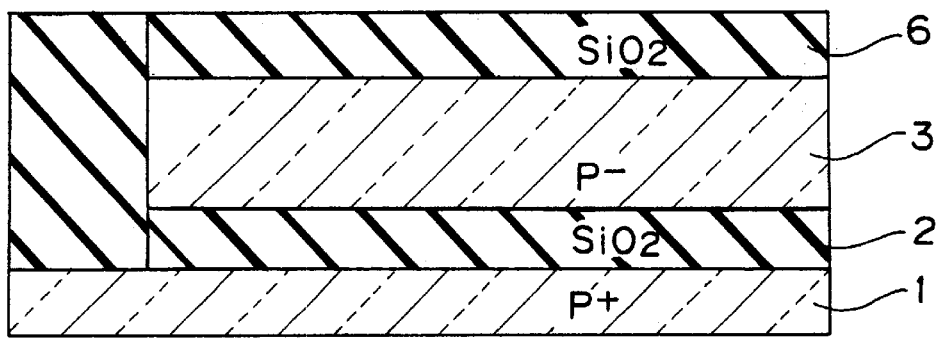

FIGS. 1A and 1B show a first embodiment of a method of manufacturing a semiconductor device according to the present invention.

FIG. 1A shows early steps of the process of manufacturing a semiconductor device wherein a first $SiO_2$ film 2 is formed as an electrically insulating layer on a semiconductor substrate 1, and a P type epitaxial layer 3 of the same conductivity type as the semiconductor substrate 1 is formed to produce an SOI substrate. A second $SiO_2$ layer 4 is formed and a resist pattern 5 is formed for the etching of a trench beneath the source electrode.

The width of the opening H is in a range from about 1 to several micrometers, preferably 1 to 2 μm, for forming an embedded electrode later. Using the resist pattern 5, the $SiO_2$ layer 4, the P type epitaxial layer 3, and the $SiO_2$ layer 4 are etched in a dry etching process.

Then, as shown in FIG. 1B, the resist 5 is removed and an $SiO_2$ film 6 is formed, covering the $SiO_2$ film 4 on top of the P type epitaxial layer 3 and filling the hole H, by a CVD method.

Figure 1C:
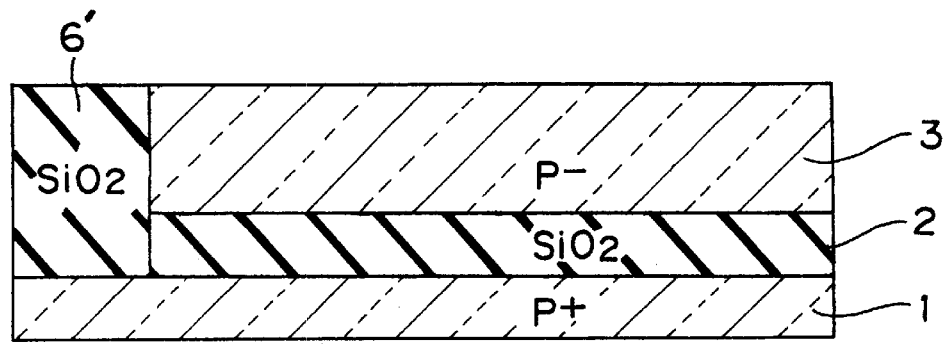

Then, as shown in FIG. 1C, the $SiO_2$ film 6 on top of the P type epitaxial layer 3 is removed by wet etching or dry etching while maintaining $SiO_2$ hole 6'.

Formation of the trench beneath the source electrode in an early step of the process makes it possible to form a minute pattern on the SOI substrate. With the $SiO_2$ film 6' being embedded, there arise no problems in subsequent photolithography steps which follow planarization of the wafer.

Although the Si trench etching is carried out down to a level of the $SiO_2$ layer 2 in this embodiment, similar effects can be achieved by etching down to the P type epitaxial layer 3.

Embodiment 2

Figure 2A:
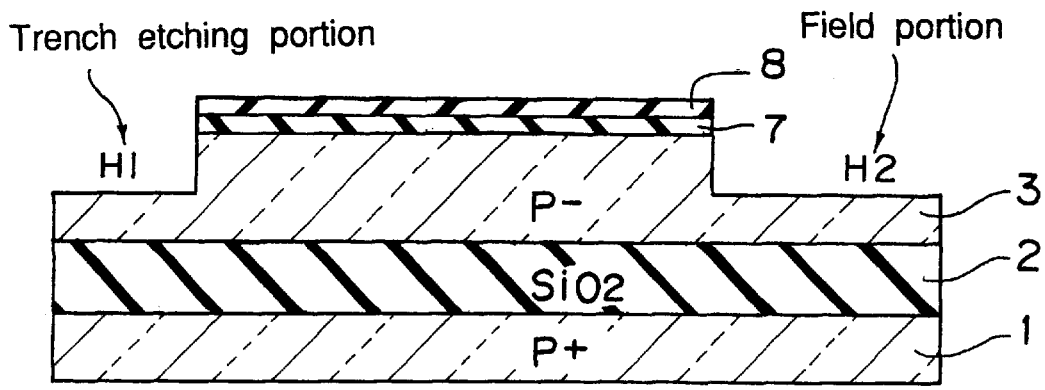
FIGS. 2A and 2B are cross-sectional views showing a manufacturing process according to a second embodiment of the present invention.
Figure 2B:
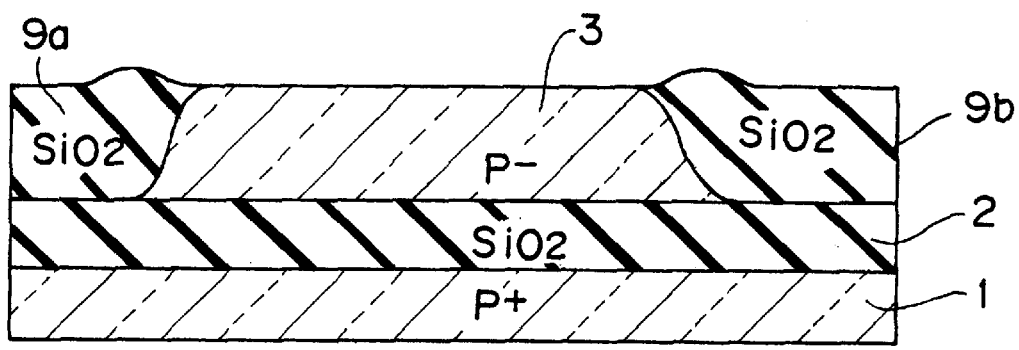

FIGS. 2A and 2B show a second embodiment of a method of embedding a conductive region in trench holes according to the present invention.

FIG. 2A shows a process of forming a thin $SiO_2$ film 7 and a thin $Si_3N_4$ film 8 on the P type epitaxial layer 3, etching the trench region just below the source electrode, and the $SiO_2$ film 7 and the $Si_3N_4$ film 8 in the field area, then etching to the P type epitaxial layer 2 to form a first hole H1 and a second hole H2. The depth of etching in this process is set so that 1) a thermal oxide film makes contact with the $SiO_2$ film 2 of the SOI substrate in the subsequent field oxidation step, and 2) the wafer surface is planarized after forming the field oxide film.

Then, as shown in FIG. 2B, field oxide films 9a and 9b are formed in the first and the second holes H1 and H2. Bottom surfaces of the field oxide films 9a and 9b are in contact with the $SiO_2$ film 2 of the SOI substrate. With the wafer surface being planarized by the etching of the P type epitaxial layer 3, there arise no problems in the subsequent photolithography step.

Thus, the FET formation area is surrounded by $SiO_2$, resulting in a decrease of parasitic capacitance so that operation at high frequencies is possible. When this configuration is applied to an integrated circuit, crosstalk between circuit elements can be decreased, making it possible to operate at high frequencies with reduced chip size.

Also, in comparison to the CVD process, the field oxidation step reduces the number of steps because trench etching is not needed.

Figure 3:
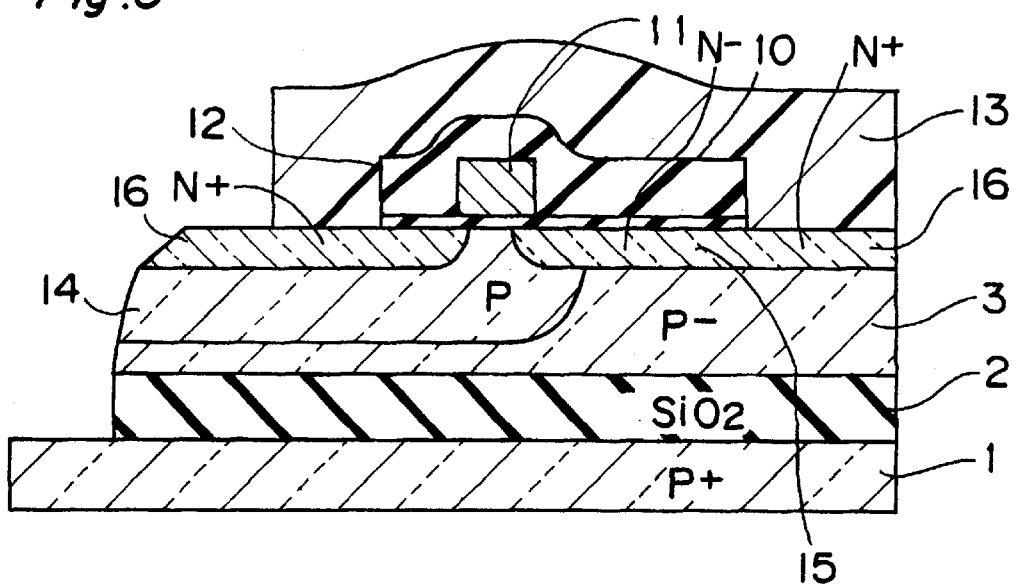
FIG. 3 is a cross-sectional view of an embodiment after completing the steps of the first and second embodiments.

FIG. 3 shows an embodiment of the present invention after the steps of the first and the second embodiments have been carried out and prior to forming the source and drain electrodes.

A gate oxide film 10, a gate electrode 11, and an interlayer film 12 are formed and then source and drain contact holes are formed. The oxide film 11 in the region of an Si trench, directly beneath the source electrode, is removed by a combination of wet etching and dry etching, after forming the resist pattern 13. At this time, the resist pattern 13 covers the field portion.

The $SiO_2$ material in the trench region, beneath the source electrode, can be selectively etched, independently of the surrounding Si, so that the width of the opening and alignment accuracy of the resist pattern 13 do not pose problems.

Figure 4:
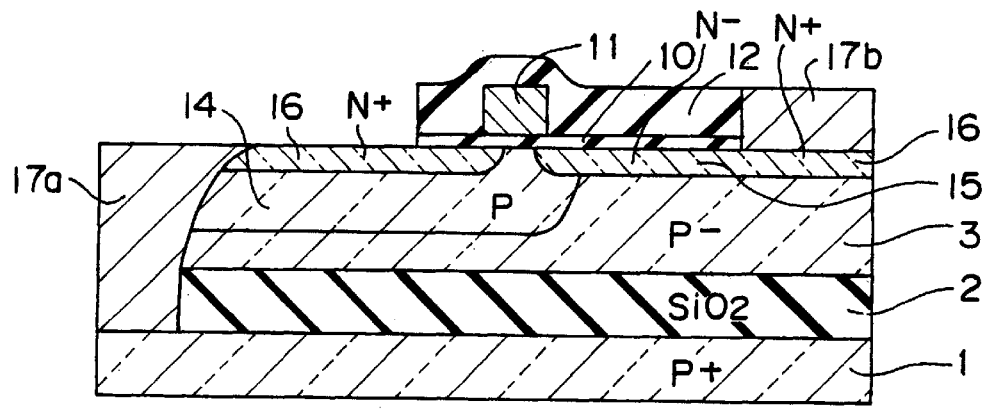
FIG. 4 is a cross-sectional view showing an embodiment after embedding conductive materials to be connected to the source and drain electrodes.

FIG. 4 shows an embodiment of the present invention after formation of electrodes (17a and 17b) formed by embedding metals such as W and Al in the trench region, beneath the source electrode, and in the drain contact hole by CVD, upon completion of the process shown in FIG. 3.

With this embedded electrode 17a, it is possible to decrease the source inductance and the ON-state resistance and to improve high-frequency characteristics. The embedded electrode 17b in the drain contact hole section makes it possible to decrease the capacitance between the drain electrode and the substrate and the gate electrode, and to improve high-frequency characteristics.

Figure 7:
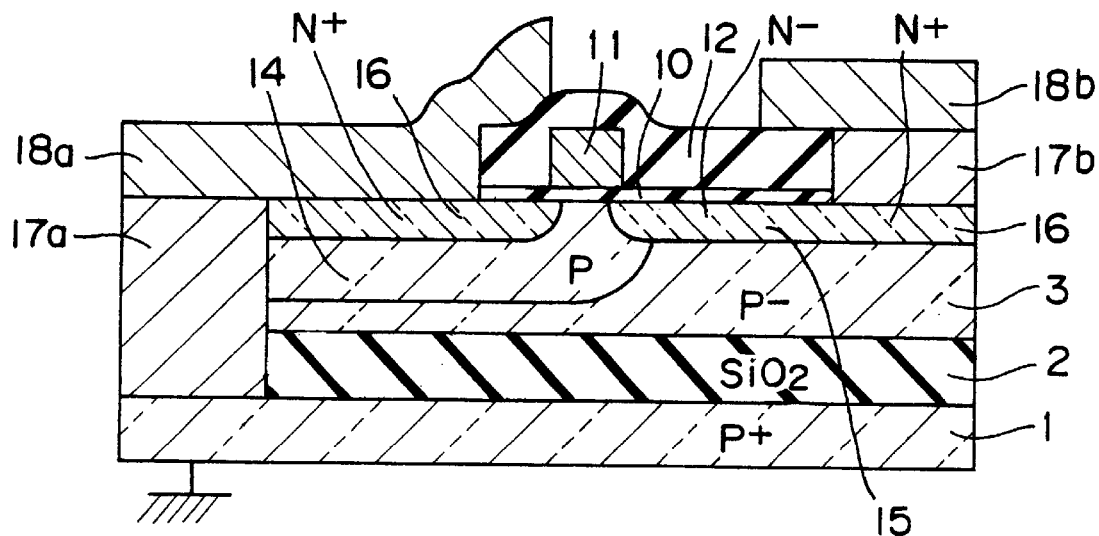
FIG. 7 is a cross-sectional view of a semiconductor device using an SOI substrate according to the present invention.
Figure 8:
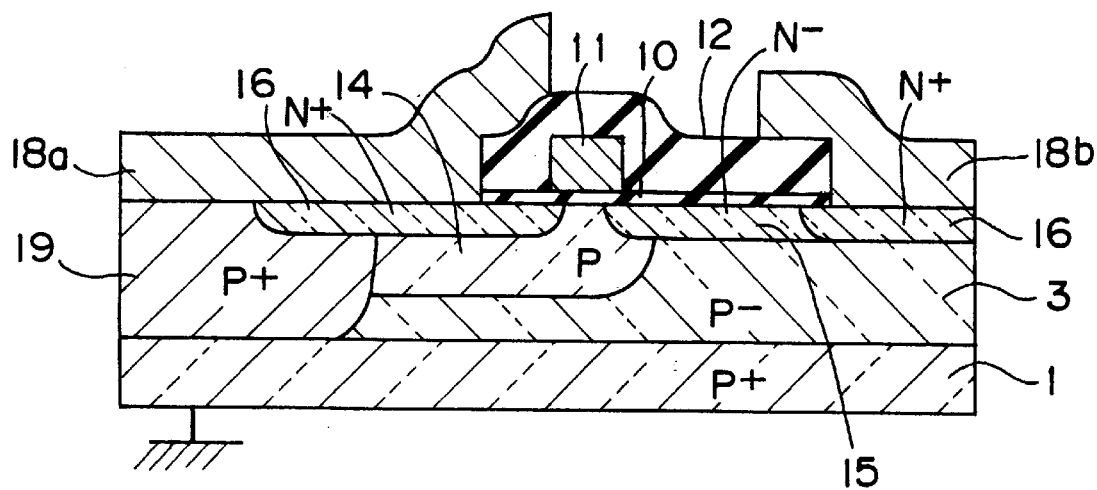
FIG. 8 is a cross-sectional view of a prior art semiconductor device.

FIG. 7 shows an embodiment of the semiconductor device according to the present invention wherein the embodiment of FIG. 4 is provided with a source electrode 18a and a drain electrode 18b. The same reference numerals as those in FIG. 4 represent identical components.

In FIG. 7, the source electrode 18a is grounded to the $P^+$ type sub layer 1 by means of the conductive portions 17a embedded just below the source electrode 18a, thereby making it possible to decrease the source inductance and the ON-state resistance. On the other hand, the conductive portions 17b embedded in the drain contact makes it possible to isolate the drain electrode 18b from the P type epitaxial layer 3 and the gate electrode 11 and to decrease the drain-substrate capacitance Cds and the gate-drain capacitance Cgd.

Moreover, the embedded electrodes make it possible to decrease the drain contact width without giving rise to the problem of coverage, compared to using an aluminum-sputtered electrode as in the prior art, so the drain-substrate capacitance can be decreased.

Embodiment 3

Figure 5A:
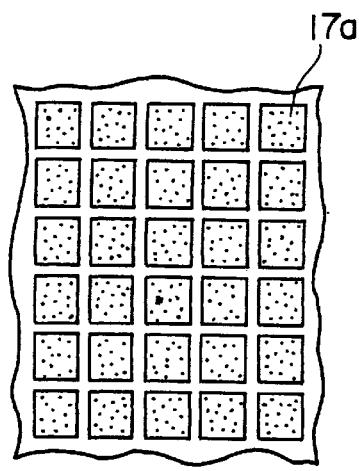
FIGS. 5A and 5B are plan views showing two types of source Si trenches, respectively.
Figure 5B:
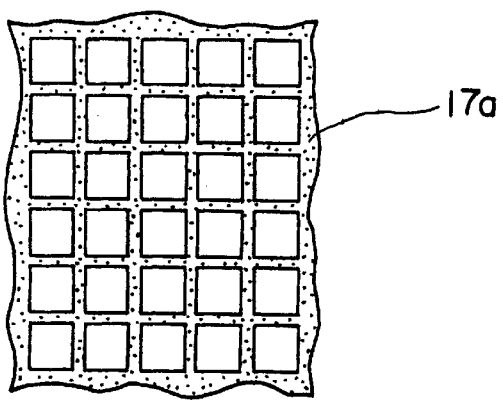

FIGS. 5A and 5B show a preferable planar configuration of conductive regions according to the present invention.

The SOI substrate has the $SiO_2$ layer 2 between the $P^+$ type sub layer 1 and the P-epitaxial layer 3. The $SiO_2$ layer 2 has a thermal conductivity of only about one hundredth that of Si. Thus, heat generated in the FET cannot be easily dissipated, resulting in rising channel temperature. The present invention employs an Si trench directly beneath the source electrode and embedded electrodes. Therefore, use of the embedded electrode can make heat generated in the FET diffuse into the P+ type sub layer to suppress a rise in the channel temperature.

In this case, it is preferable to increase the areas of the Si trench-etched region and the embedded electrode, while the width of the trench opening is only about 1 to 2 μm. Therefore, it is preferable to arrange the trenches, made by etching of Si, in a grid pattern wherein embedded electrodes 17a are formed, as shown by the stippling in FIG. 5A. In this case, the FETs are located in the regions that surround the islands of embedded electrodes.

The embedded electrodes 17a may also be formed to surround FETs that are arranged in a lattice configuration, as indicated by the stippling in FIG. 5B.

The more the embedding area is increased, the more heat generated in the FETs can be dissipated into the P+ type sub layer. While high-frequency current generally flows in the surface of a conductor, fine division of the Si trench-etched regions and the embedded electrodes, as in this embodiment, increases the length along the periphery of the grounded section, thereby facilitating high-frequency operation.

Figure 6A:
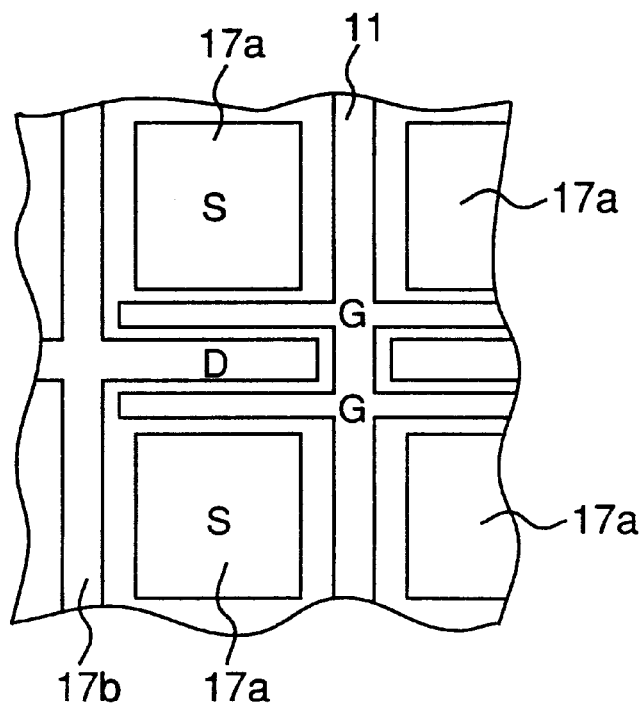
FIGS. 6A and 6B show two types of arrangements of an FET drive section according to preferred embodiments of the present invention.
Figure 6B:
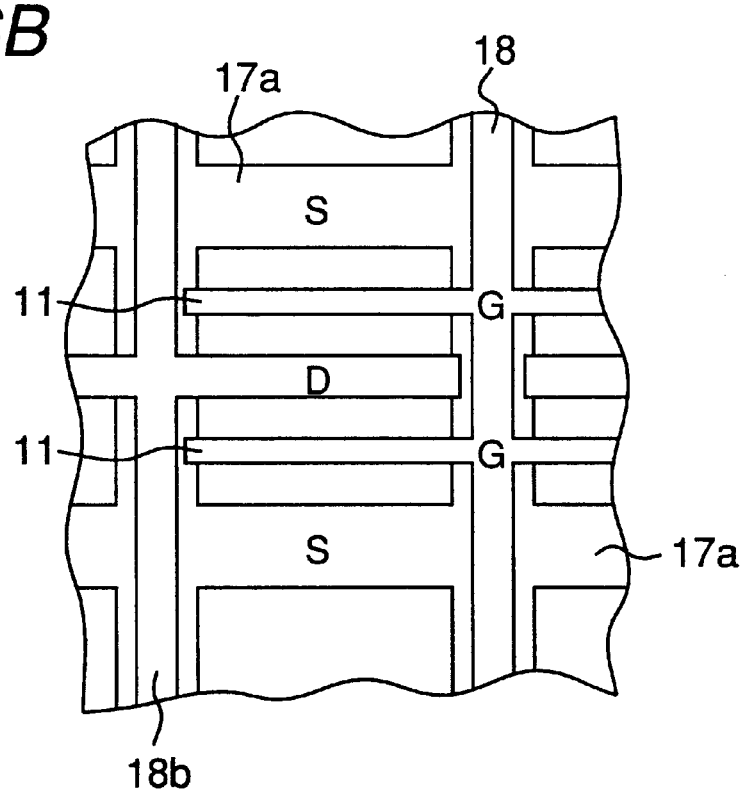

FIGS. 6A and 6B are top views of configurations in which the FETs are arranged as shown in FIGS. 5A and 5B. In the drawing, numeral 11 denotes a gate electrode, 17a denotes a source electrode, 17b denotes a drain electrode, 18 denotes a gate electrode including two layers of aluminum, and 18b denotes a drain electrode.

This configuration may also be applied to source bonding pads in the field region, as well as just below the source electrode, improving effects further.

While the configuration and the manufacturing method of this embodiment have been described as applied to a MOSFET with an SOI substrate, the present invention may also be applied to a prior art silicon MOSFET.

According to the present invention, as will be understood from the above description, because a source electrode of a MOSFET is connected to a semiconductor substrate, which is grounded, through a conductive portion that penetrates an insulating layer of an SOI structure, heat generated in the MOSFET is dissipated into the semiconductor substrate, and source inductance and ON-state resistance are decreased by the SOI substrate. Further, the heat generated in the drive sections of devices can be dissipated efficiently, thereby making it possible to maintain high performance over an extended period of time.

Arrangement of the conductive regions in a grid pattern or lattice configuration surrounding the operating sections of each of the MOSFETs on the substrate of the SOI structure beneath the source electrode further improves heat dissipation efficiency of the devices.

Further, connection of the drain electrode of the MOSFET to the embedded electrodes in the drain contact decreases drain-substrate capacitance and gate-drain capacitance.

Furthermore, formation of holes in an early stage of a wafer formation process, with the holes being refilled with Si later, keeps the holes as small as several micrometers prior to the formation of the source and drain wrings, making it possible to provide a wiring configuration allowing high-density packaging.

Selective removal of SiO$_2$ from the holes in a wet etching process provides fine trench holes of high accuracy even with a rough resist pattern.

Simultaneously embedding electrodes in the drain contact holes as well as in the trench holes directly beneath the source electrode simplifies manufacturing processes and provides a semiconductor device with decreased drain-substrate capacitance and gate-drain capacitance.

The Si trench holes directly beneath the source electrode, arranged in a grid pattern or lattice configuration, provide a semiconductor device having a high heat dissipation efficiency.

What is claimed is:

1. A high-frequency MOSFET device including:
   a Silicon-On-Insulator (SOI) structure comprising, successively laminated, a semiconductor layer of a first conductivity type, an insulator layer, and a grounded semiconductor substrate of the first conductivity type, and a plurality of MOSFETs located in said semiconductor layer of said SOI structure, each MOSFET comprising a source electrode connected to said grounded semiconductor substrate by an electrically conductive region penetrating said insulator layer and reaching said grounded semiconductor substrate, said conductive region conducting heat from said MOSFETs to said semiconductor substrate and comprising a grid pattern including mutually isolated areas arranged in a two dimensional array on said SOI structure.

2. The high-frequency MOSFET device according to claim 1, wherein said conductive region is embedded in trenches.

3. The high-frequency MOSFET device according to claim 1, wherein each of said MOSFETs includes a drain electrode connected to a drain contact to decrease drain-substrate capacitance and gate-drain capacitance.

4. A high-frequency MOSFET device including:
   a Silicon-On-Insulator (SOI) structure comprising, successively laminated, a semiconductor layer of a first conductivity type, an insulator layer, and a grounded semiconductor substrate of the first conductivity type, and
   a plurality of MOSFETs located in said semiconductor layer of said SOI structure, each MOSFET comprising a source electrode connected to said grounded semiconductor substrate by an electrically conductive region penetrating said insulator layer and reaching said grounded semiconductor substrate, said conductive region conducting heat from said MOSFETs to said semiconductor substrate and comprising a lattice configuration including electrically conductive stripes lying along each of two intersecting directions on said SOI structure.

5. The high-frequency MOSFET device according to claim 4, wherein said conductive region has a width of about one to several microns.

6. The high-frequency MOSFET device according to claim 4, wherein said conductive region is embedded in trenches.

7. The high-frequency MOSFET device according to claim 4, wherein each of said MOSFETs includes a drain electrode connected to a drain contact to decrease drain-substrate capacitance and gate-drain capacitance.

* * * * *